(12) United States Patent
Triyoso et al.

(10) Patent No.: US 8,420,519 B1
(45) Date of Patent: Apr. 16, 2013

(54) METHODS FOR FABRICATING INTEGRATED CIRCUITS WITH CONTROLLED P-CHANNEL THRESHOLD VOLTAGE

(75) Inventors: Dina Triyoso, Dresden (DE); Elke Erben, Dresden (DE); Klaus Hempel, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/286,292

(22) Filed: Nov. 1, 2011

(51) Int. Cl.
 *H01L 21/283* (2006.01)
(52) U.S. Cl.
 USPC ..... 438/592; 438/656; 438/785; 257/E21.204
(58) Field of Classification Search .................. 257/412, 257/E21.204; 438/592, 652, 656, 658, 785
 See application file for complete search history.

(56) References Cited

U.S. PATENT DOCUMENTS

| | | | | |
|---|---|---|---|---|
| 6,445,033 | B1 * | 9/2002 | Hasegawa | 257/324 |
| 6,753,618 | B2 * | 6/2004 | Basceri et al. | 257/296 |
| 7,326,610 | B2 * | 2/2008 | Amos et al. | 438/231 |
| 7,453,161 | B2 * | 11/2008 | Van Haren et al. | 257/797 |
| 7,837,838 | B2 * | 11/2010 | Chua et al. | 204/192.22 |
| 8,119,461 | B2 * | 2/2012 | Trentzsch et al. | 438/143 |
| 2009/0311877 | A1 * | 12/2009 | Olsen et al. | 438/770 |

* cited by examiner

*Primary Examiner* — Tuan N. Quach
(74) *Attorney, Agent, or Firm* — Ingrassia Fisher & Lorenz, P.C.

(57) ABSTRACT

Methods are provided for fabricating integrated circuits having controlled threshold voltages. In accordance with one embodiment a method includes forming a gate dielectric overlying an N-doped silicon substrate and depositing a layer of titanium nitride and a layer of tantalum nitride overlying the gate dielectric. A sub-monolayer of tantalum oxide is deposited overlying the layer of tantalum nitride by a process of atomic layer deposition, and oxygen is diffused from the tantalum oxide through the tantalum nitride and titanium nitride.

19 Claims, 3 Drawing Sheets

METHODS FOR FABRICATING INTEGRATED CIRCUITS WITH CONTROLLED P-CHANNEL THRESHOLD VOLTAGE

TECHNICAL FIELD

The present invention generally relates to methods for fabricating integrated circuits, and more particularly relates to methods for fabricating field effect transistor integrated circuits having controlled P-channel threshold voltages.

BACKGROUND

The majority of present day integrated circuits (ICs) are fabricated with a large number of interconnected field effect transistors (FETs), often called metal, oxide, semiconductor field effect transistors (MOSFETs or simply MOSTs). FETs can be either N-channel (NFET) or P-channel (PFET). Many ICs include both NFETs and PFETs. A FET includes a gate electrode as a control electrode and spaced apart source and drain regions formed in a semiconductor substrate and between which a current can flow. A control voltage applied to the gate electrode controls the flow of current through a channel between the source and drain regions. The gate electrode is electrically insulated from the underlying channel by a gate dielectric.

In the past, the gate electrode was typically formed of polycrystalline silicon (poly) and the gate dielectric was thermally grown silicon dioxide. To improve device performance, today many IC transistors use a high dielectric constant (high-k) insulator as the gate dielectric and several layers of metal or other conductive material as the gate electrode (a high-k metal gate transistor). Regardless of whether the IC is a poly gate structure or a high-k metal gate structure, fabricating a high yielding IC requires a method that controls the threshold voltage, the minimum control voltage applied to the gate electrode to initiate current flow, of all transistors of the IC. Control of threshold voltage, including setting the threshold voltage to a particular value is difficult, especially setting and controlling the threshold voltage of high-k metal gate PFETs. One method has been to oxygen anneal the partially formed metal gate, high-k dielectric structure, but this method can result in oxygen diffusing through the partially formed metal gate to the dielectric layer. The dielectric layer typically consists of two parts, a thin base oxide and an overlying high-k layer. Oxygen diffusion can result in enhanced base oxide thickness through regrowth of the base oxide. The increased thickness results in a reduced dielectric constant because of the enhanced equivalent oxide thickness. Additionally, the annealing temperature required for this process can be incompatible with the thermal budget for replacement metal gate technology.

Accordingly, it is desirable to provide methods for fabricating integrated circuits that control the threshold voltage, especially the threshold voltage of PFETs in the IC. In addition, it is desirable to provide methods for fabricating integrated circuits that are high yielding and are compatible with replacement metal gate integration. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating integrated circuits having controlled threshold voltages. In accordance with one embodiment a method includes forming a gate dielectric overlying an N-doped silicon substrate and depositing a layer of titanium nitride and a layer of tantalum nitride overlying the gate dielectric. A sub-monolayer of tantalum oxide is deposited overlying the layer of tantalum nitride by a process of atomic layer deposition, and oxygen is diffused from the tantalum oxide through the tantalum nitride and titanium nitride.

In accordance with a further embodiment, a method includes forming a gate dielectric overlying an N-doped silicon substrate and depositing a layer of titanium nitride and a layer of tantalum nitride overlying the gate dielectric. A controlled oxidation of the layer of tantalum nitride and the layer of titanium nitride is effected to control the threshold voltage.

In accordance with yet another embodiment a method is provided in which a layer of gate dielectric is formed overlying an N-doped silicon substrate. An electrically conductive capping layer is formed overlying the gate dielectric layer and an electrically conductive etch stop layer is formed overlying the capping layer. A tantalum oxide layer is deposited overlying the stop layer, and oxygen is diffused from the tantalum oxide layer through the stop layer and the capping layer.

BRIEF DESCRIPTION OF THE DRAWINGS

The present invention will hereinafter be described in conjunction with the following drawing figures, wherein like numerals denote like elements, and wherein FIGS. 1-5 schematically illustrate, in simplified cross-sectional views, method steps for fabricating an integrated circuit in accordance with various embodiments.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-5 schematically illustrate, in simplified cross-sectional views, method steps for fabricating an integrated circuit (IC) 20 in accordance with various embodiments. Only a portion of one transistor, a P-channel field effect transistor (PFET), of the IC is illustrated in the FIGURES, but those of skill in the art will understand how to apply the methods described herein to other PFETs of the IC. IC 20 may also include N-channel FETs (NFETs), but those devices need not be illustrated as they can be fabricated in the normal manner. Various steps in the manufacture of FET ICs are well known and so, in the interest of brevity, many conventional steps will only be mentioned briefly herein or will be omitted entirely without providing the well known process details.

Figure 1:
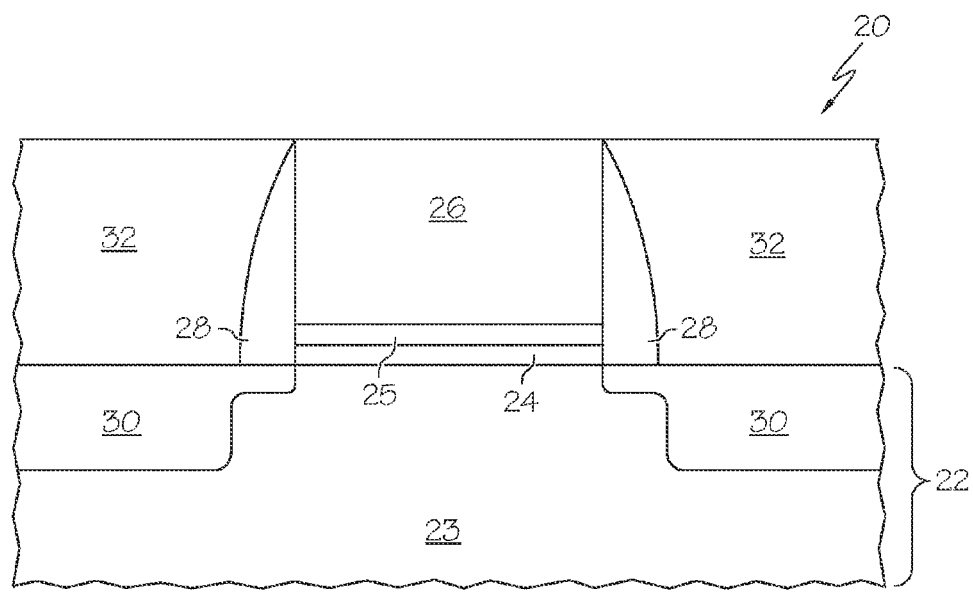

The methods for fabricating IC 20 described herein relate to replacement high-k metal gate technology. FIG. 1 illustrates the results of several conventional initial steps in the fabrication of IC 20. In accordance with these conventional initial steps, a silicon substrate 22 is provided and an N-doped region 23 is formed in at least a portion of the substrate. By "silicon substrate" is meant a substrate formed of substantially pure silicon or silicon admixed with germanium or other elements as is typically used in the fabrication of integrated circuits. The silicon substrate can be a bulk silicon wafer (as illustrated) or a thin layer of silicon on an insulating layer (SOI). The N-doped region can be formed, for example, by the ion implantation of N-type conductivity-determining ions such as arsenic or phosphorus into substrate 22 to form an N-well.

A gate dielectric layer 24 is formed overlying N-doped region 23. In accordance with one embodiment, the gate dielectric layer is a high-k dielectric layer having a thickness of about 2 nanometers (nm). By "high-k dielectric" is meant a dielectric having a dielectric constant greater than the dielectric constant of silicon dioxide (about 3.9) and typically much higher than the dielectric constant of silicon dioxide. The high-k dielectric layer can be, for example, a layer of a high dielectric constant material such as an oxide of hafnium, either alone or in combination with a thin underlying layer of silicon oxide. An electrically conductive capping layer 25 is deposited overlying the gate dielectric. The electrically conductive capping layer can be, for example, a layer of titanium nitride having a thickness of about 2 nm. A layer of polycrystalline silicon or other dummy gate material is deposited overlying the electrically conductive capping layer and is patterned and etched to form a dummy gate 26.

Sidewall spacers 28 are formed on the sidewalls of the dummy gate, for example by depositing a layer of silicon nitride or other insulating material and anisotropically etching the insulating material such as by reactive ion etching (RIE). P-type source and drain regions 30 are formed in the N-doped silicon substrate in self alignment with the dummy gate and the sidewall spacers by the ion implantation of P-type impurities such as ions of boron. A layer of dielectric material 32, often referred to as an interlayer dielectric (ILD), is deposited and planarized to expose a top portion of the dummy gate. The ILD layer can be, for example, a layer of silicon oxide deposited from a tetraethyl orthosilicate (TEOS) source and planarized by chemical mechanical planarization (CMP).

Figure 2:
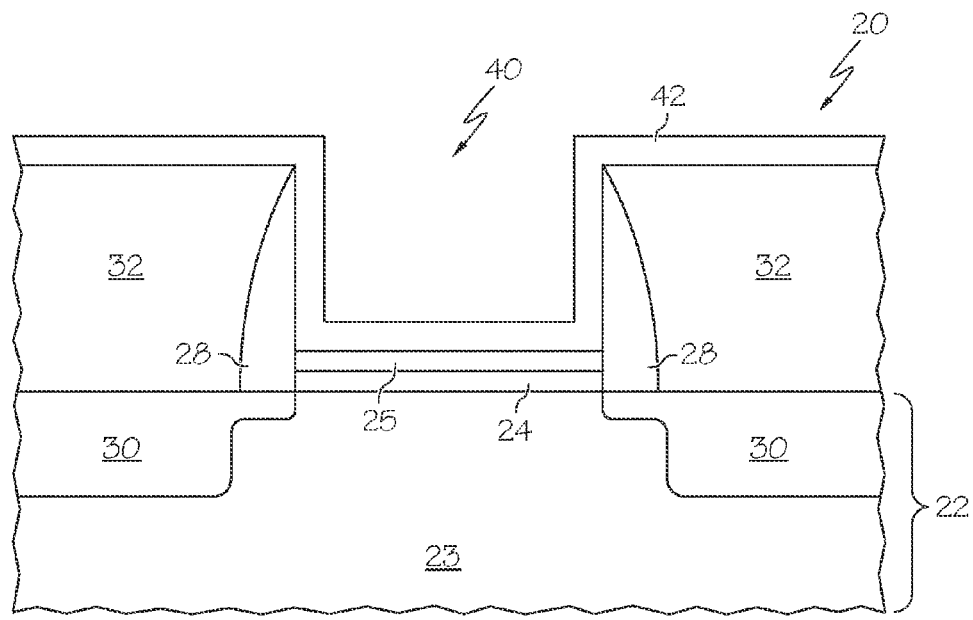

Other process steps may be applied to IC 20 such as the formation of metal silicide contacts to the source and drain regions, the growth of stress inducing layers in the silicon substrate in the source and drain regions, and the like, but such steps are not illustrated in order to avoid making the FIGURES too complex or to obscure the description of the present method. After ILD layer 32 is planarized and the top of dummy gate 26 is exposed, the method in accordance with one embodiment continues as illustrated in FIG. 2. Dummy gate 26 is removed by etching using an etchant that preferentially etches the dummy gate material without substantially etching sidewall spacers 28, ILD 32, or capping layer 25 to form a void 40. An electrically conductive etch stop layer 42 is deposited in the void and contacting capping layer 25, the inner walls of the sidewall spacers 28 and the planarized surface of ILD layer 32. The electrically conductive etch stop layer can be, for example, a layer of tantalum nitride having a thickness of about 1.5 nm.

Figure 3:
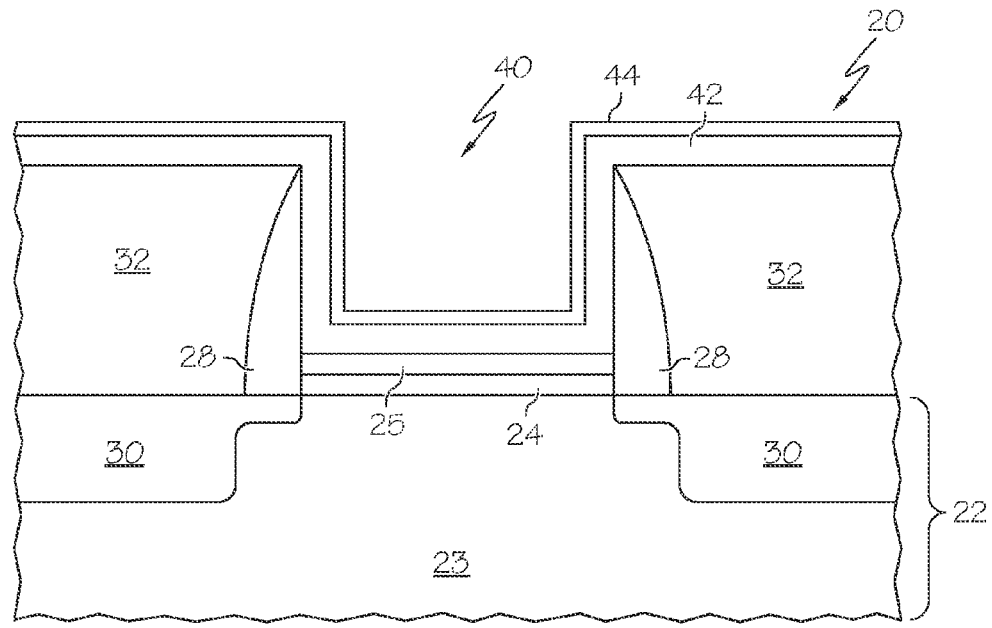

In order to control the threshold voltage of the PFETs being fabricated in IC 20, electrically conductive etch stop layer 42 and electrically conductive capping layer 25 are partially and controllably oxidized. In accordance with one embodiment, a thin layer, preferably a sub-monolayer, of oxide 44 is deposited overlying the electrically conductive etch stop layer as illustrated in FIG. 3. The thin layer of oxide can be, for example, a layer of tantalum oxide deposited by low temperature atomic layer deposition or other deposition method that is capable of controllably depositing thin layers. ALD is a surface controlled layer-by-layer process for the deposition of thin films with atomic layer accuracy. ALD deposits one atomic layer at a time through a reaction cycle of alternative pulsing of precursors and reactants. Tantalum oxide can be deposited, for example, at a deposition temperature between about 275° C. and 400° C., at a reaction pressure between about 1 and 10 Torr, with precursors such as a tantalum halide (e.g., $TaCl_5$ or $TaF_5$) or metal-organic tantalum with an oxidant such as water, oxygen or ozone. Each atomic layer formed in the sequential process is a result of saturated surface controlled reactions. Because of the self limiting nature of the ALD process, precise film thickness and conformity can be achieved. Thin oxide layer 44 can be deposited, for example, to a thickness of 0.5 nm or less and preferably to a thickness of 0.3 nm or less.

Figure 4:
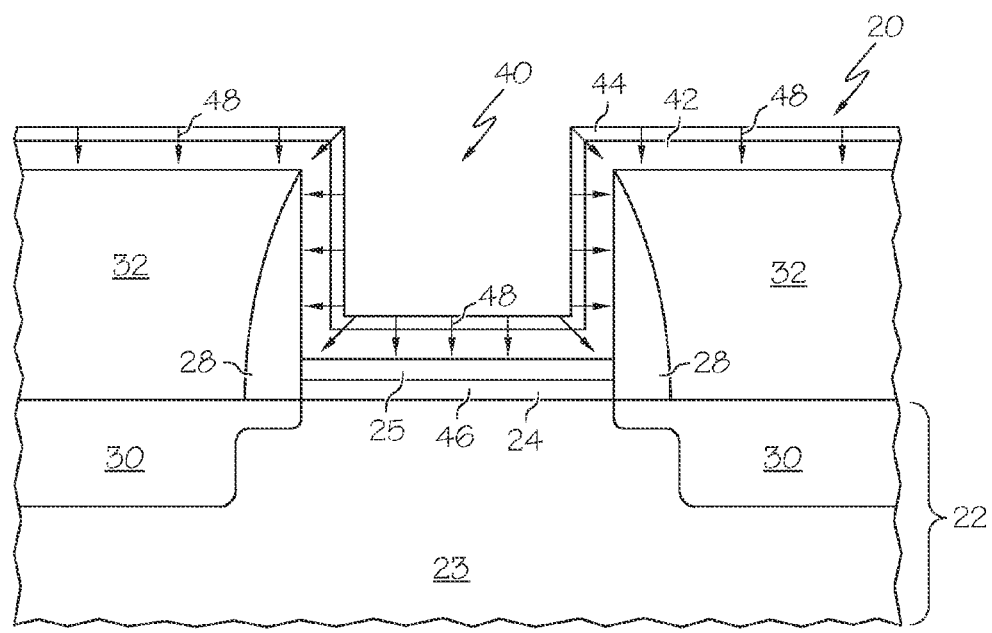
Figure 5:
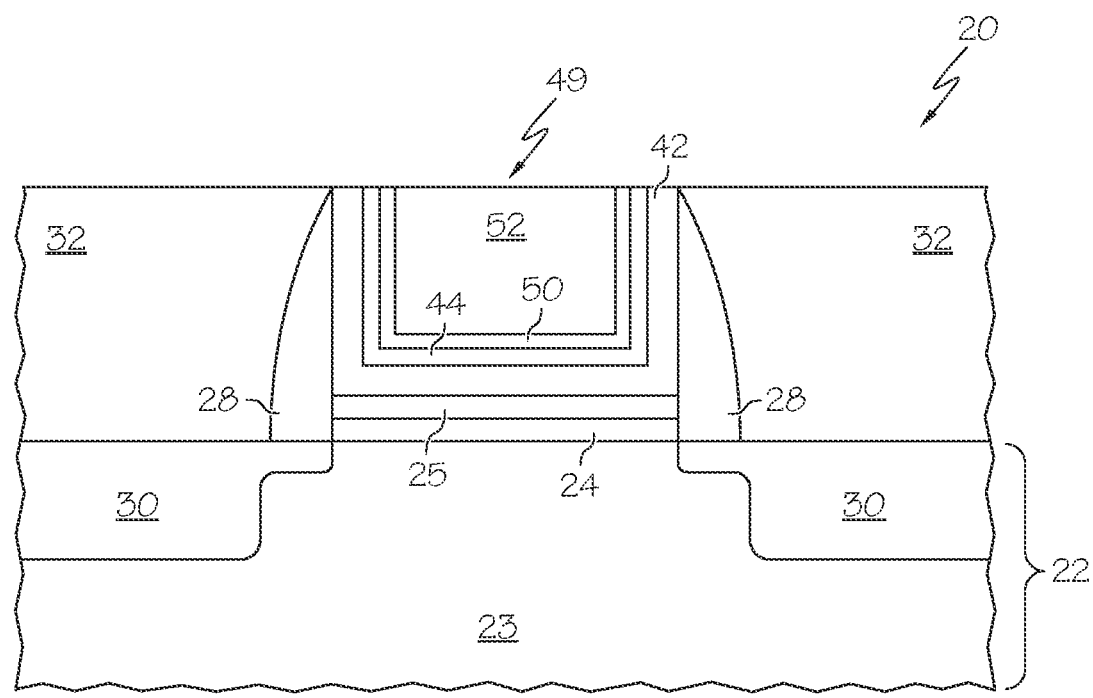

In subsequent steps, either dedicated annealing steps or heating associated with other processing steps, oxygen from the thin oxide layer diffuses through electrically conductive etch stop layer 42 and electrically conductive capping layer 25 to the interface 46 between the capping layer and gate dielectric layer 24 as illustrated in FIG. 4 by arrows 48. Controlling the thickness of oxide layer 44 aids in controlling the amount of oxygen that diffuses through the etch stop and capping layers to the capping layer-gate dielectric layer interface. The applicants believe that the controlled partial oxidation of the etch stop layer and the capping layer results in the desired threshold voltage of the PFETs of IC 20.

In accordance with a further embodiment, although not illustrated, the controlled oxidation of electrically conductive etch stop layer 42 and electrically conductive capping layer 25 to achieve the desired threshold voltage of PFETs of the IC can be accomplished by a low temperature plasma treatment. In this embodiment the structure of FIG. 2 is subjected to an oxygen or oxygen plus nitrogen plasma at a temperature of about 200° C. or less. The plasma treatment can be carried out, for example with reactants $N_2H_2$, $H_2$, and $O_2$ at a plasma energy of about 2500 Watts.

The gate structures of IC 20 are completed by filling void 40 with a gate electrode material overlying etch stop layer 42. The gate electrode material can be, for example, a metal. A metal gate electrode 49 can be formed, for example, by depositing a work function-determining layer 50 such as a layer of titanium nitride having a thickness of 2-5 nm followed by a layer of aluminum or an aluminum alloy 52 of sufficient thickness to fill void 40. Excess gate electrode material and the electrically conductive etch stop material overlying the planarized surface are removed, for example by CMP to achieve the structure illustrated in FIG. 5.

In the foregoing, embodiments have been described in which a gate dielectric 24 and an electrically conductive capping layer 25 have been formed prior to the formation of dummy gate 26. Although not illustrated, those familiar with the replacement gate process will understand that in an alternate embodiment a disposable gate dielectric layer can be formed before the formation of the dummy gate and that a permanent dielectric layer and electrically conductive capping layer can be formed after the removal of the dummy gate and disposable gate dielectric layer and before the deposition of the electrically conductive etch stop layer.

After forming gate electrode 49, methods for fabricating IC 20 proceed in conventional manner. Such methods include, for example, forming metallized contacts extending through ILD 32, the formation of additional ILD layers, the deposition and patterning of interconnect metallization to contact device regions as needed to implement the IC being fabricated, and the like.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
   forming a gate dielectric overlying a silicon substrate;
   depositing a layer of titanium nitride overlying the gate dielectric;
   depositing a layer of tantalum nitride overlying the layer of titanium nitride;
   effecting a controlled oxidation of the layer of tantalum nitride and the layer of titanium nitride; and
   forming a metal gate electrode overlying the layer of tantalum nitride.

2. The method according to claim 1 wherein effecting a controlled oxidation comprises exposing the layer of tantalum nitride to a low temperature plasma environment comprising reactants selected from the group consisting of oxygen and oxygen plus nitrogen.

3. A method for fabricating an integrated circuit comprising:
   forming a gate dielectric overlying a silicon substrate;
   depositing a layer of titanium nitride overlying the gate dielectric;
   depositing a layer of tantalum nitride overlying the layer of titanium nitride;
   depositing a sub-monolayer of oxide overlying the layer of tantalum nitride; and
   diffusing oxygen from the sub-monolayer of oxide through the layer of tantalum nitride and the layer of titanium nitride.

4. The method according to claim 3 wherein depositing a sub-monolayer of oxide comprises depositing a sub-monolayer of tantalum oxide.

5. The method according to claim 4 wherein depositing a sub-monolayer of tantalum oxide comprises depositing tantalum oxide by a process of atomic layer deposition.

6. The method according to claim 4 wherein forming a gate dielectric comprises forming a layer of high dielectric constant insulator;
   depositing a layer of titanium nitride comprises depositing a layer of titanium nitride having a thickness of about 2 nm;
   depositing a layer of tantalum nitride comprises depositing a layer of tantalum nitride having a thickness of about 1.5 nm; and
   depositing a sub-monolayer of tantalum oxide comprises depositing a sub-monolayer of tantalum oxide having a thickness of about 0.3-0.5 nm.

7. A method for fabricating an integrated circuit comprising:
   forming a gate dielectric overlying a silicon substrate;
   depositing a layer of titanium nitride overlying the gate dielectric;
   depositing a layer of tantalum nitride overlying the layer of titanium nitride;
   effecting a controlled oxidation of the layer of tantalum nitride and the layer of titanium nitride; and
   before depositing the layer of tantalum nitride:
      forming a dummy gate electrode overlying the layer of titanium nitride;
      forming sidewall spacers on the dummy gate electrode;
      depositing and planarizing a layer of oxide overlying the dummy gate electrode; and
      removing the dummy gate electrode.

8. A method for fabricating an integrated circuit comprising:
   forming a gate dielectric overlying an N-doped silicon substrate;
   forming an electrically conductive capping layer overlying the gate dielectric;
   forming an electrically conductive etch stop layer overlying the capping layer;
   depositing a tantalum oxide layer overlying the etch stop layer; and
   diffusing oxygen from the tantalum oxide layer through the stop layer and the capping layer.

9. The method according to claim 8 wherein forming an electrically conductive capping layer comprises depositing a layer of titanium nitride.

10. The method according to claim 8 wherein forming an electrically conductive etch stop layer comprises depositing a layer of tantalum nitride.

11. The method according to claim 8 wherein depositing a tantalum oxide layer comprises depositing a layer of tantalum oxide having a thickness of less than 0.5 nm.

12. The method according to claim 8 further comprising forming a metal gate electrode overlying the layer of tantalum nitride.

13. The method according to claim 8 wherein forming a gate dielectric comprises forming a layer of high dielectric constant material and wherein diffusing oxygen comprises heating to diffuse oxygen to an interface between the high dielectric constant material and the electrically conductive capping layer.

14. A method for fabricating an integrated circuit comprising:
   forming a gate dielectric overlying an N-doped silicon substrate;
   depositing a layer of titanium nitride overlying the gate dielectric;
   depositing a layer of tantalum nitride overlying the layer of titanium nitride;
   depositing a sub-monolayer of tantalum oxide by a process of atomic layer deposition overlying the layer of tantalum nitride;
   diffusing oxygen from the tantalum oxide through the tantalum nitride and titanium nitride; and
   forming a metal gate electrode overlying the layer of tantalum nitride.

15. The method according to claim 14 wherein forming a gate dielectric comprises depositing a layer of high dielectric constant material and wherein diffusing oxygen comprises heating to diffuse oxygen to an interface between the layer of high dielectric constant material and the layer of titanium nitride.

16. The method according to claim 14 further comprising:
   before depositing the layer of tantalum nitride, forming a dummy gate electrode overlying the layer of titanium nitride;
   forming sidewall spacers on the dummy gate electrode;
   depositing and planarizing a layer of silicon oxide; and
   removing the dummy gate electrode.

17. The method according to claim 14 further comprising:
   forming a polycrystalline silicon dummy gate electrode overlying the N-doped silicon substrate;
   forming sidewall spacers on the dummy gate electrode;
   depositing and planarizing a layer of silicon oxide; and removing the dummy gate electrode before forming the gate dielectric.

18. The method according to claim 14 wherein forming a metal gate electrode comprises:
   depositing a layer of work function-determining material overlying the layer of tantalum nitride; and
   depositing a gate electrode metal overlying the layer of work function-determining material.

19. The method according to claim 14 wherein depositing a sub-monolayer of tantalum oxide comprises depositing a layer of tantalum oxide having a thickness less than or equal to about 0.5 nm.

* * * * *